United States Patent
Hirata

(10) Patent No.: US 6,489,770 B1
(45) Date of Patent: Dec. 3, 2002

(54) NUCLEAR MAGNETIC RESONANCE IMAGING APPARATUS

(75) Inventor: Satoshi Hirata, Kokubunji (JP)

(73) Assignee: Hitachi Medical Corporation, Tokyo (JP)

(*) Notice: Subject to any disclaimer, the term of this patent is extended or adjusted under 35 U.S.C. 154(b) by 0 days.

(21) Appl. No.: 09/497,682

(22) Filed: Feb. 4, 2000

(30) Foreign Application Priority Data

Feb. 5, 1999 (JP) .......................................... 11-028823

(51) Int. Cl.[7] ................................................. G01V 3/00
(52) U.S. Cl. ........................................ 324/320; 324/309
(58) Field of Search ............................... 324/320, 319, 324/317, 318, 300, 306, 307, 309, 312, 314

(56) References Cited

U.S. PATENT DOCUMENTS 4,899,109 A * 2/1990 Tropp et al. ................. 324/319
5,343,151 A * 8/1994 Cory et al. ................... 324/319
6,064,208 A * 5/2000 Steckner ...................... 324/300

* cited by examiner

Primary Examiner—Louis Arana
(74) Attorney, Agent, or Firm—Antonelli, Terry, Stout & Kraus, LLP

(57) ABSTRACT

First, prior to the measurement of the magnetic resonance spectroscopic image, the gradient polarity of a gradient magnetic field to be applied to an object is inverted periodically. This makes it possible to measure a multi-gradient echo type magnetic resonance signal that has been subjected to the influence of an eddy current. Then, from the magnetic resonance spectrum obtained therefrom, a peak of the frequency component is extracted that corresponds to a hydrogen nucleus in the water molecule. Finally, using a static magnetic field homogeneity degree-adjusting unit, a shimming current to be flowed through a shimming coil and/or an offset current to be flowed through a gradient magnetic field generating coil are adjusted so that the width of the peak becomes narrow, thereby enhancing the degree of the static magnetic field homogeneity.

25 Claims, 4 Drawing Sheets

NUCLEAR MAGNETIC RESONANCE IMAGING APPARATUS

BACKGROUND OF THE INVENTION

The present invention relates to a magnetic resonance imaging apparatus. More particularly, it relates to a magnetic resonance imaging apparatus that is suitable for an imaging performed by a multi-gradient echo type pulse sequence that aims at shortening the measurement time (i.e., for example, an echo planar spectroscopic imaging that allows space distribution information about the chemical shift to be measured at high speed).

The magnetic resonance imaging apparatus is an apparatus that performs the imaging in the following way: An object placed within a static magnetic field is irradiated with a radio frequency pulse with a specific frequency corresponding to a specific substance included in the object, thereby giving rise to a magnetic resonance phenomenon of the specified substance. Then, a magnetic resonance signal occurring from the object is utilized so as to image the chemical and physical information on the substance.

In particular, a method that has been known as a magnetic resonance spectroscopic imaging (MRSI) is as follows: A difference in the magnetic resonance frequency (hereinafter, referred to as a chemical shift), which is attributed to a dissimilarity in the chemical bond of a variety of molecules, is measured, thereby obtaining a space distribution image for each molecule (hereinafter, referred to as a chemical shift image).

Here, the magnitude of the chemical shift attributed to the dissimilarity in the chemical bond of the molecules is, usually, of the order of ppm (i.e., 1/1-millionth), which is exceedingly small. On account of this, in the MRSI, it becomes important to adjust the homogeneity of the magnetic field that exerts influences on the magnetic resonance frequency.

In general, one of the factors that exert considerable influences upon the homogeneity of the magnetic field is the existence of an object. This condition requires that the homogeneity of the magnetic field be enhanced in a state where the object is placed within the magnetic field. As a method of adjusting the homogeneity of the magnetic field, there has been proposed the following method (for example, in literatures such as "Journal of Magnetic Resonance", Vol. 77, pp. 40–52 (1988)): Two kinds of values, i.e., the respective offset values of gradient magnetic fields in mutually different three directions and amounts of the electric currents to be flowed through the respective shimming coils, are varied so as to superimpose, on the static magnetic field, the magnetic fields that the respective gradient magnetic field generating coils generate and magnetic fields that the respective shimming coils generate, thereby adjusting the degree of the magnetic field homogeneity.

In this method, with a phantom employed as the subject to be measured, a reference image is scanned in advance that indicates current-magnetic field distribution characteristics of the respective gradient magnetic field generating coils and the respective shimming coils. Next, the object is inserted into the magnetic field, and a magnetic field distribution image within the object is measured as a target image of a subject to be shimmed. Then, the current-magnetic field distribution characteristics of the respective gradient magnetic field generating coils and the respective shimming coils are obtained from the reference image. Moreover, combinations of the distribution characteristics (values of the currents to be flowed through the respective coils) are calculated so as to uniform the magnetic field distribution within the object, then adjusting of the magnetic field is carried out on the basis of the combinations calculated.

As the reference image and the target image used here, a phase distribution image obtained by MRI (magnetic resonance imaging) is generally employed. In order to measure this phase distribution image, an imaging sequence called a spin echo pulse sequence is usually used. In particular, a pulse sequence is used in which the spin echo time and the gradient echo time are shifted by an amount of $\Delta t$.

SUMMARY OF THE INVENTION

In the conventional technique described in the above-mentioned literature, however, there exists a problem that no consideration has been given to the adjustment of the homogeneity of the magnetic field in the case where the multi-gradient echo type pulse sequence is used for the purpose of shortening the measurement time.

Namely, in the multi-gradient echo type pulse sequence, gradient polarity of a high-intensity gradient magnetic field is inverted continuously in a short period of time so as to measure echo train signals including a plurality of echo signals. This causes an eddy current of large amplitude to occur on such places as the inner surface of a bore within a magnet or the surface of the object. Accordingly, there exists a serious problem that a magnetic field induced by the eddy current makes the magnetic field distribution inhomogeneous at the detection time of the echo signals. However, in the spin echo pulse sequence in the conventional technique with which the reference image is measured, one echo signal is measured with a single excitation, and it is not repeated to invert the polarity of high-intensity gradient magnetic field in a short period of time. On account of this, there appears no influence of the eddy current upon the reference image data obtained. This results in a problem that it is impossible to perform an adjustment in which the eddy current has been taken into consideration.

Incidentally, there are many cases where, in order to cancel out the influences of the eddy current, a gradient coil equipped with an active shield is used. It is difficult, however, to completely cancel out the eddy current occurring on the inner surface of the magnet bore, and thus the active shield exhibits no effect of eliminating the eddy current on the object surface. Consequently, it has been required to execute the adjustment of the degree of the magnetic field homogeneity in which the eddy current has been taken into consideration.

It is an object of the present invention to improve the adjustment of the homogeneity of the magnetic field in the magnetic resonance imaging apparatus that uses the multi-gradient echo type imaging pulse sequence.

A representative configuration (a first configuration) of a representative magnetic resonance imaging apparatus according to the present invention includes a static magnetic field generating unit for generating a static magnetic field to be applied to an object, a shimming magnetic field generating unit (shimming coil) for generating a N-channel ($N \geq 3$) shimming magnetic field that adjusts the degree of the static magnetic field homogeneity, a gradient magnetic field generating unit (gradient magnetic field generating coil) for generating first, second and third directions of gradient magnetic fields to be applied to the object, a radio frequency pulse generating unit (radio frequency pulse generating coil) for generating a radio frequency pulse to be applied to the object, a signal detecting unit for detecting a magnetic resonance signal generated from the object, a computing unit for performing computation in accordance with the magnetic resonance signal detected by the signal detecting unit, a pulse sequence controlling unit for controlling operations of the shimming magnetic field generating unit, the gradient magnetic field generating unit, the radio frequency pulse generating unit and the signal detecting unit, and a static magnetic field homogeneity degree-adjusting unit for controlling the shimming magnetic field generating unit and/or the gradient magnetic field generating unit so as to adjust the degree of the static magnetic field homogeneity.

Moreover, the pulse sequence controlling unit executes a static magnetic field-adjusting pulse sequence control that causes the magnetic resonance signal to be detected while applying at least one direction of gradient magnetic field from among the gradient magnetic fields with gradient polarity of the one direction of gradient magnetic field being inverted periodically. In addition, the computing unit reconstructs a magnetic resonance spectrum from the magnetic resonance signal and extracts a peak of the frequency component, the magnetic resonance signal being detected by the static magnetic field-adjusting pulse sequence control, the peak corresponding to a specific nucleus. Furthermore, the static magnetic field homogeneity degree-adjusting unit adjusts the degree of the static magnetic field homogeneity so that the width of the extracted peak becomes narrow.

Explaining the above-mentioned description in more detail, the pulse sequence controlling unit performs the control explained in the following (i.e., the static magnetic field-adjusting pulse sequence control): An exciting radio frequency pulse is applied simultaneously with the gradient magnetic field of the third direction so as to selectively excite nuclear spins contained in slices or volumes in the third direction. After that, after a time set in advance has elapsed, an inverting radio frequency pulse is applied simultaneously with the gradient magnetic field of the third direction. Next, the reading-out gradient magnetic field of the first direction is applied with the gradient polarity thereof being inverted periodically, thereby generating echo train signals including the chemical shift and the spatial information in the first direction and then detecting the echo train signals.

Subsequently, the computing unit, from the echo train signals detected by the static magnetic field-adjusting pulse sequence control, determines a magnetic resonance spectroscopic image involving 2-dimensional information on the chemical shift and the spatial information in the first direction. Then, the computing unit creates an integrated spectrum over the entire slices or volumes by adding the spectra of reading-out points in the first direction. Moreover, the computing unit extracts, from the integrated spectrum, a peak corresponding to a hydrogen nucleus in a water molecule, then calculating the width of the peak. Furthermore, the static magnetic field homogeneity degree-adjusting unit adjusts the degree of the static magnetic field homogeneity so that the width of the calculated peak becomes narrow.

When the computing unit obtains at least one of the magnetic resonance image, the magnetic resonance spectrum and the magnetic resonance spectroscopic image, prior to the measurements of the magnetic resonance image, the magnetic resonance spectrum and the magnetic resonance spectroscopic image, the configuration as described above permits the pulse sequence controlling unit to periodically invert the gradient polarities of the gradient magnetic fields to be applied to the object or the phantom. This makes it possible to detect the multi-gradient echo type magnetic resonance signal subjected to the influences of the eddy current. Moreover, the computing unit reconstructs the magnetic resonance spectrum from the magnetic resonance signal, then extracting the peak of the frequency component corresponding to the specific nucleus. Furthermore, the static magnetic field homogeneity degree-adjusting unit performs the adjustment so that the width of the peak becomes narrow, i.e., becomes steep. This adjustment improves the degree of the static magnetic field homogeneity.

At this time, in the case of the MRSI that measures the chemical information on a living body, it is desirable to select, as the specific nucleus, a nucleus contained in the water (for example, the hydrogen nucleus).

More concretely, in the above-described configuration, the following is preferable: The static magnetic field homogeneity degree-adjusting unit, in accordance with the peak width, changes an offset current value for the gradient magnetic field of one direction by a certain fixed amount. After that, it is repeated a set number of times to perform a control of causing the pulse sequence controlling unit and the computing unit to execute the measurement of the peak width again, thereby searching and determining an optimum offset current value so that the peak width becomes the narrowest. In this case, after the optimum offset current value for the gradient magnetic field of one direction has been searched and determined, it is preferable to search and determine, in sequence, optimum offset current values for the gradient magnetic fields of other directions.

Also, in substitution for or in combination with the above-described operation of adjusting the degree of the static magnetic field homogeneity through the gradient magnetic fields, it is possible to adjust current values of the respective shimming coils of the shimming magnetic field generating unit including the plurality of shimming coils. In this case, the static magnetic field homogeneity degree-adjusting unit, in accordance with the detected peak width, changes only a value of a current to be flowed through one channel of shimming coil. After that, it is repeated a plurality of times to execute the static magnetic field-adjusting pulse sequence control and to execute the calculation of the peak width, thereby determining an optimum value of the current to be flowed through the above-described one channel of shimming coil so that the peak width becomes the narrowest. In addition, after determining the optimum value of the current to be flowed through the above-described one channel of shimming coil, the static magnetic field homogeneity degree-adjusting unit determines, in sequence, optimum values of currents to be flowed through the plurality of channels of shimming coils other than the above-described one channel of shimming coil.

In this way, the pre measurement (pre scan) is executed that is to be executed prior to the main measurement (main scan) of the magnetic resonance spectroscopic image. Accordingly, it becomes possible to set, in a short while and with excellent reproducibility, the optimum offset current values for the gradient magnetic fields of the three directions and/or the optimum values of the currents to be flowed through the shimming coils for generating the plurality of channels of shimming magnetic field so that the peak width becomes the narrowest.

A representative configuration of a magnetic resonance imaging method according to the present invention includes a step of generating a static magnetic field to be applied to an object, a step of generating a N-channel ($N \geq 3$) shimming magnetic field for adjusting the degree of the static magnetic field homogeneity, a step of generating the gradient magnetic fields of the first, second and third directions to be applied to the object, a step of generating a radio frequency pulse to be applied to the object, a step of detecting a magnetic resonance signal generated from the object, a computing step of performing computation in accordance with the magnetic resonance signal detected by a signal detecting unit, a pulse sequence controlling step of controlling operations of a shimming magnetic field generating unit, a gradient magnetic field generating unit, a radio frequency pulse generating unit and the signal detecting unit, and a static magnetic field homogeneity degree-adjusting step of controlling the shimming magnetic field generating unit and/or the gradient magnetic field generating unit so as to adjust the degree of the static magnetic field homogeneity.

Moreover, at the pulse sequence controlling step, a static magnetic field-adjusting pulse sequence control is executed that detects the magnetic resonance signal while applying a gradient magnetic field of at least one direction of the three directions with gradient polarity of the gradient magnetic field of one direction being inverted periodically. At the computing step, a magnetic resonance spectrum is reconstructed from the magnetic resonance signal and a peak of the frequency component is extracted, then calculating width of the peak, the magnetic resonance signal being detected by the static magnetic field-adjusting pulse sequence control, the peak corresponding to a specific nucleus. Furthermore, at the static magnetic field homogeneity degree-adjusting step, the degree of the static magnetic field homogeneity is adjusted so that the width of the peak becomes narrow.

Explaining the above-mentioned description in more detail, at the pulse sequence controlling step, the control explained in the following (i.e., the static magnetic field-adjusting pulse sequence control) is executed: First, an exciting radio frequency pulse is applied simultaneously with the gradient magnetic field of the third direction so as to selectively excite nuclear spins contained in slice or volume in the third direction. After that, after a time set in advance has elapsed, an inverting radio frequency pulse is applied simultaneously with the above-described gradient magnetic field of the third direction. Next, the reading-out gradient magnetic field of the first direction is applied with the gradient polarity thereof being inverted periodically, thereby generating echo train signals including the chemical shift and the spatial information in the first direction and then detecting the echo train signals.

Subsequently, at the computing step, from the echo train signals detected by the static magnetic field-adjusting pulse sequence control, a magnetic resonance spectroscopic image is reconstructed that has 2-dimensional information on the chemical shift and the spatial information in the first direction. Then, an integrated spectrum over the entire slice or volume is created by adding the spectra of the reading-out points in the first direction. Moreover, a peak corresponding to a hydrogen nucleus in a water molecule is extracted from the integrated spectrum, then the width of the peak is calculated. Furthermore, at the static magnetic field homogeneity degree-adjusting step, the degree of the static magnetic field homogeneity is adjusted so that the peak width determined by the calculation becomes narrow.

In this way, in the magnetic resonance imaging method according to the present invention, the pre measurement (pre scan) is executed. Accordingly, it becomes possible to set, in a short while and with excellent reproducibility, optimum offset current values for the gradient magnetic fields of the three directions and/or optimum values of currents to be flowed through shimming coils for generating a shimming magnetic field of a plurality of channels so that the peak width becomes the narrowest. Namely, with the eddy current taken into consideration, the degree of the static magnetic field homogeneity is adjusted. This makes it possible to solve the serious problem that a magnetic field, which the eddy current induces, makes inhomogeneous the magnetic field distribution at the time of detecting the echo signals. Consequently, it becomes possible to measure, in a short while, a chemical shift image with less inhomogeneity of the static magnetic field.

Incidentally, in substitution for or in combination with the above-described operation of adjusting the degree of the static magnetic field homogeneity through the gradient magnetic fields, it is possible to adjust current values of the respective shimming coils of the shimming magnetic field generating unit including the plurality of shimming coils. In this case, in the static magnetic field homogeneity degree-adjusting unit in the above-described magnetic resonance imaging apparatus, when searching and determining a value of an i-optimum current to be flowed through an i-channel (i=1, 2, . . . , N) shimming coil, the search and the determination are performed in the following way: In the case where a value of a j-optimum current to be flowed through a j-channel (j=1, 2, . . . , N, where j≠i) shimming coil has been already searched and determined, a current the value of which is equal to the value of the j-optimum current is flowed through the j-channel (j=1, 2, . . . , N, where j≠i) shimming coil. In the case where the value of the j-optimum current to be flowed through the j-channel (j=1, 2, . . . , N, where j≠i) shimming coil has not been searched and determined yet, the search and the determination are performed in the following way: In a state where no current is flowed through the j-channel (j=1, 2, . . . , N, where j≠i) shimming coil, in accordance with the peak width, only a value of a current to be flowed through the i-channel (i=1, 2, . . . , N) shimming coil is changed. After that, it is repeated a plurality of times for the pulse sequence controlling unit to execute the static magnetic field-adjusting pulse sequence control, and it is repeated a plurality of times for the computing unit to execute the calculation of the peak width. This, thereby, makes it possible to search and determine in sequence the value of the i-optimum current to be flowed through the i-channel (i=1, 2, . . . , N) shimming coil so that the peak width becomes the narrowest.

Also, at the static magnetic field homogeneity degree-adjusting steps in the above-described magnetic resonance imaging method, when searching and determining a value of an i-optimum current to be flowed through an i-channel (i=1, 2, . . . , N) shimming coil, the search and the determination are performed in the following way: In the case where a value of a j-optimum current to be flowed through a j-channel (j=1, 2, . . . , N, where j≠i) shimming coil has been already searched and determined, a current the value of which is equal to the value of the j-optimum current is flowed through the j-channel (j=1, 2, . . . , N, where j≠i) shimming coil. In the case where the value of the j-optimum current to be flowed through the j-channel (j=1, 2, . . . , N, where j≠i) shimming coil has not been searched and determined yet, the search and the determination are performed in the following way: In a state where no current is flowed through the j-channel (j=1, 2, . . . , N, where j≠i) shimming coil, in accordance with the above-mentioned peak width, only a value of a current to be flowed through the i-channel (i=1, 2, . . . , N) shimming coil is changed. After that, it is repeated a plurality of times at the pulse sequence controlling step to execute the static magnetic field-adjusting pulse sequence control, and it is repeated a plurality of times at the computing step to execute the calculation of the peak width. This, thereby, makes it possible to search and determine in sequence the value of the i-optimum current to be flowed through the i-channel (i=1, 2, . . . , N) shimming coil so that the peak width becomes the narrowest.

Moreover, in the above-described explanation, the following conditions can be suitably selected: Employing the half-value width as the peak width, employing a peak width corresponding to a value that is equal to 20% of the peak maximum intensity, and so on.

The following is the summary of a representative invention in the present invention given by referring to FIG. 1:

Prior to measurements of the magnetic resonance image, the magnetic resonance spectrum and the magnetic resonance spectroscopic image, the pulse sequence controlling unit periodically inverts gradient polarities of the gradient magnetic fields to be applied to an object or a phantom. This makes it possible to measure the multi-gradient echo type magnetic resonance signal subjected to influences of the eddy current. Then, from the magnetic resonance spectrum obtained in accordance with the magnetic resonance signal, a peak of the frequency component is extracted that corresponds to a nucleus contained in the water. Next, the static magnetic field homogeneity degree-adjusting unit performs the adjustment so that width of the peak becomes narrow, i.e., becomes steep, thereby improving the degree of the static magnetic field homogeneity.

As having been explained so far, the present invention makes it possible to improve the adjustment of the homogeneity of the magnetic field in the magnetic resonance imaging apparatus that uses the multi-gradient echo type imaging pulse sequence. As a result, it becomes possible to measure, in a short while, the chemical shift image with no influence of the inhomogeneity of the magnetic field.

DESCRIPTION OF THE EMBODIMENTS

Figure 1:
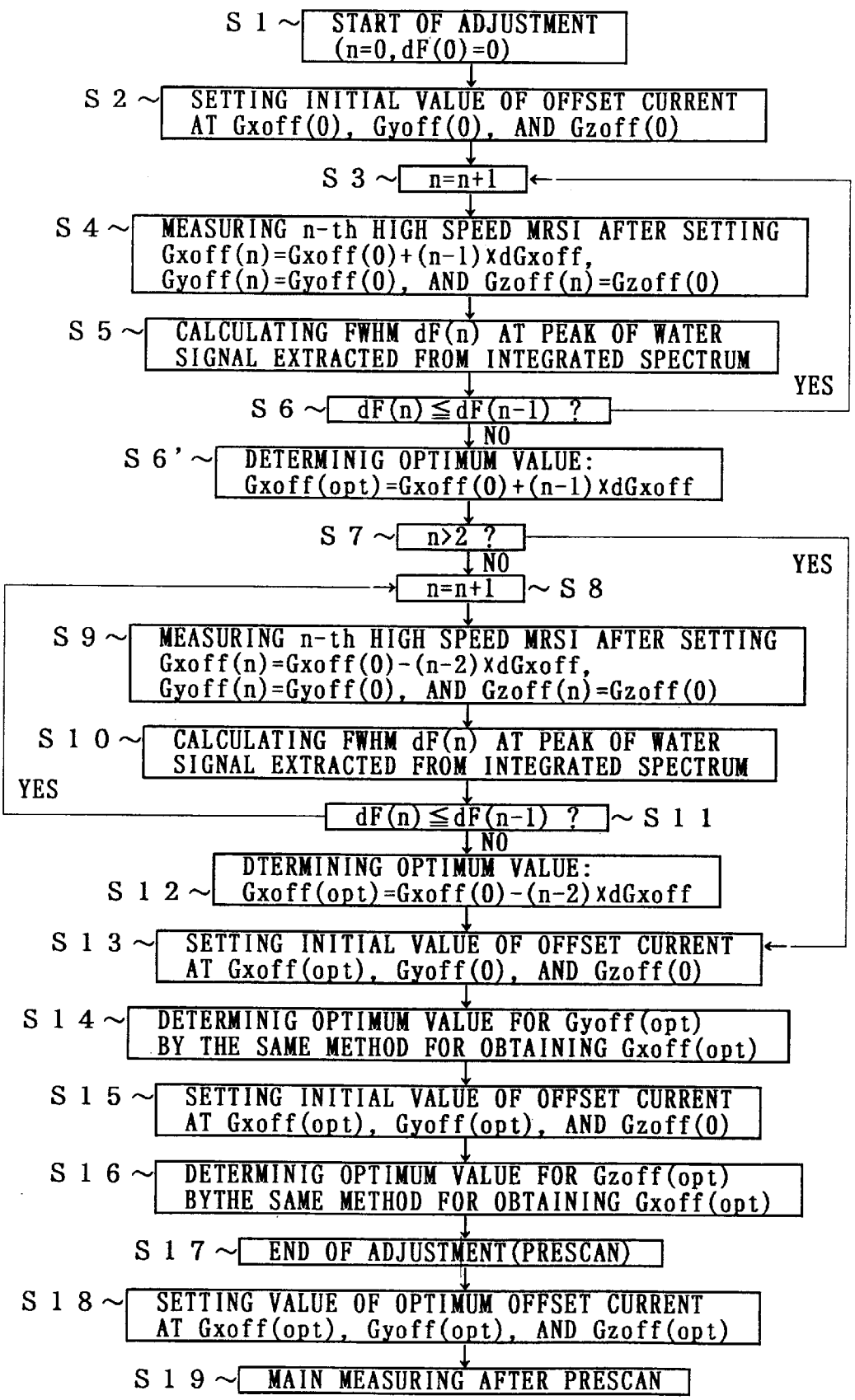
FIG. 1 is a flow chart for indicating an embodiment of adjusting procedure related to the adjustment of the degree of the static magnetic field homogeneity according to the present invention.
Figure 2:
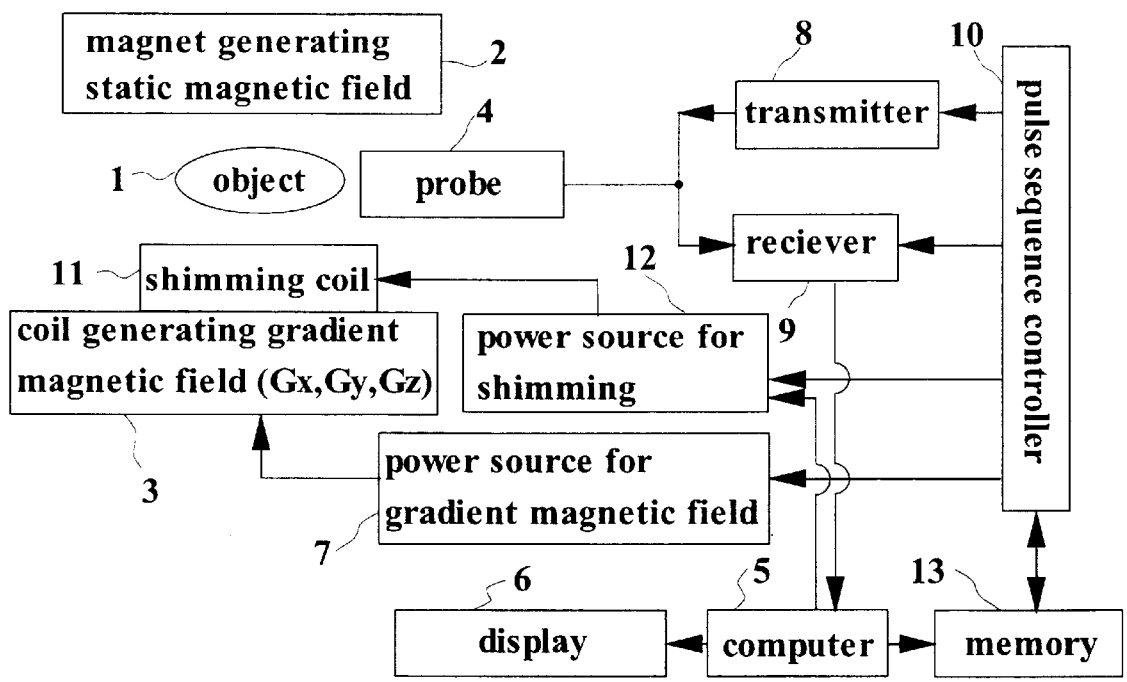
FIG. 2 is an entire configuration diagram of an embodiment of a magnetic resonance imaging apparatus to which the present invention is applicable.
Figure 3:
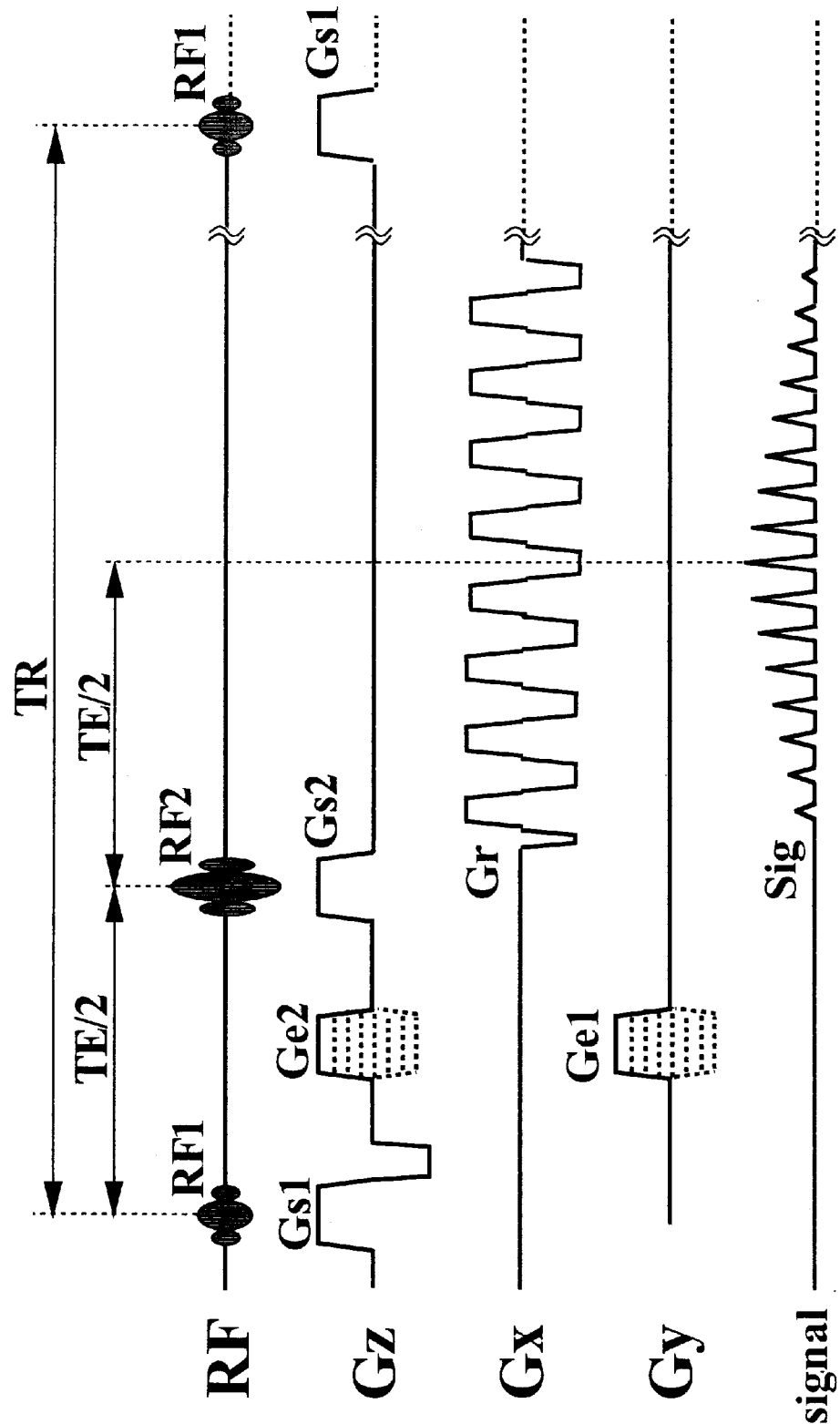
FIG. 3 is a diagram for illustrating an echo planar spectroscopic imaging pulse sequence that is an embodiment of an imaging pulse sequence to which the present invention is suited to be applied.

Hereinafter, referring to the drawings, the explanation will be given concerning embodiments of the present invention. FIG. 1 is a flow chart for indicating an embodiment of an adjusting procedure concerning the degree of the static magnetic field homogeneity related to characteristics of the present invention. FIG. 2 illustrates an entire configuration diagram of an embodiment of a magnetic resonance imaging apparatus to which the present invention is applied. FIG. 3 illustrates an echo planar spectroscopic imaging pulse sequence, i.e., an embodiment of a multi-gradient echo type pulse sequence that becomes a subject of the problem-solving carried out by the present invention.

As illustrated in FIG. 2, the magnetic resonance imaging apparatus includes the following apparatuses: A magnet generating static magnetic field 2, a coil generating gradient magnetic field 3 and a power source for gradient magnetic field 7 that constitute a gradient magnetic field generating unit, a transmitter 8 constituting a radio frequency pulse generating unit, a probe 4 for applying a radio frequency pulse to an object 1 and detecting a magnetic resonance signal generated from the object 1, a receiver 9 for performing a reception processing such as a detection processing of the magnetic resonance signal detected by the probe 4, a computer 5 for fetching the magnetic resonance signal, which has undergone the reception processing, and performing a computation processing such as an image reconstruction, a display 6 for displaying the reconstructed image and so on, a memory 13 for storing information such as an image signal and a measurement condition, a shimming coil 11 and a power source for shimming 12 that constitute a shimming magnetic field generating unit for adjusting the degree of the static magnetic field homogeneity, a pulse sequence controller 10 for controlling the entire operations and functions, and so on.

In general, the coil generating gradient magnetic field 3 includes gradient magnetic field coils (Gx, Gy, Gz) along three axes (x, y, z) that are perpendicular to each other. The shimming coil 11 includes shimming coils of a plurality of channels having different magnetic field distribution characteristics, and the power source for shimming 12 supplies currents to the respective shimming coils. Of the shimming coils, coils with a primary characteristic (X, Y, Z channels) have a possibility of causing interferences with the gradient magnetic fields.

Accordingly, in some cases, the coils with the primary characteristic are integrated with the coil generating gradient magnetic field 3.

The pulse sequence controller 10 includes both a pulse sequence controlling unit and a static magnetic field homogeneity degree-adjusting unit. The static magnetic field homogeneity degree-adjusting unit, at the time of adjusting the degree of the static magnetic field homogeneity, adjusts the degree of the static magnetic field homogeneity through the control of currents flowed through the respective shimming coils, the control of an offset current value of the coil generating gradient magnetic field 3 or the control obtained from the combination thereof. Also, the pulse sequence controlling unit sends an instruction to the computer 5, the power source for gradient magnetic field 7, the transmitter 8, the receiver 9 and so on, thereby carrying out the control so that each of the apparatuses operates with a timing and an intensity that are programmed in advance.

The object 1 is placed in a space where there are applied the static magnetic field generated by the magnet generating static magnetic field 2 and the mutually different gradient magnetic fields of the three directions generated by the coil generating gradient magnetic field 3.

FIG. 3 illustrates the echo planar spectroscopic imaging pulse sequence as an embodiment of the multi-gradient echo type imaging pulse sequence that is a subject concerning the adjustment of the degree of the static magnetic field homogeneity carried out by the present invention. This imaging pulse sequence has been known as a high-speed MRSI that allows the magnetic resonance spectroscopic image to be obtained at a high speed (For example, JP-A-61-13143). In the imaging pulse sequence, as illustrated in FIG. 3, at first, an exciting radio frequency pulse RF1 (90° pulse) is applied simultaneously with a gradient magnetic field Gs1 of Z axis-direction for slice (volume)-selecting, thereby selectively exciting nuclear spins contained within a region to be employed as the subject of the measurement.

Next, phase-encoding gradient magnetic fields Ge1, Ge2 of Y axis-direction and Z axis-direction are applied to the magnetizations caused by the above-described excitation, thereby adding spatial information in the Y axis-direction and the Z axis-direction to a phase of each of the magnetizations. Moreover, in TE/2 (TE: echo time) after the application of RF1, an inverting radio frequency pulse RF2 (180° pulse) is applied simultaneously with a gradient magnetic field Gs2 of Z axis-direction for slice (volume)-selecting. This operation rephases the nuclear spin phases of which have been shifted to each other due to the inhomogeneity of the static magnetic field, causing spin echo signals to be generated in TE/2 after the application of RF2. Furthermore, at the time of measuring the spin echo signals, a reading-out gradient magnetic field Gr of the X axis-direction is applied with the gradient polarity thereof being inverted periodically, thereby generating echo train signals Sig including the chemical shift and the spatial information in the X axis-direction.

As a waveform of the reading-out gradient magnetic field Gr, a trapezoidal wave or a sine wave is usable. The application intensities of the phase-encoding gradient magnetic fields Ge1, Ge2 are varied in a step-by-step manner indicated by dashed lines in FIG. 3. This causes the above-described series of sequence to be repeated at an interval of TR and by the number of times that is equivalent to the number of the pixels (i.e., the number of the picture elements) in the Y axis-direction and the Z axis-direction. For example, in order to obtain an image the number of the spatial matrices of which is equal to mx×my×mz (m: integer), a conventional method (4D-CSI), which is used most widely at present, requires that the excitation and the measurement be repeated mx×my×mz times. In contrast to this, the high-speed MRSI illustrated in FIG. 3 necessitates the excitations and the measurements of my×mz times, thus allowing the measurement time to be shortened down to 1/mx of the measurement time in the conventional method.

Next, the description will be given below concerning a data processing method in the high-speed MRSI illustrated in FIG. 3. The echo train signals Sig obtained by the above-described measurement are frequency-modulated by both an external magnetic interaction due to the reading-out gradient magnetic field Gr and an internal magnetic interaction corresponding to the chemical shift. Namely, when attention is paid to the respective echo signals one by one, as is the case with the respective echo signals obtained by an ultra high-speed EPI (echo planar imaging) method used widely at present in the MRI, the spatial information in the reading-out axis-direction has been frequency-encoded.

Also, when attention is paid to central points of the respective echo signals, the interaction due to the reading-out gradient magnetic field Gr is canceled out at these points. Accordingly, it turns out that an envelope of the echo train signals resulting from connecting the respective central points has been modulated by the chemical shift alone. Then, executing the data processing described below makes it possible to extract the chemical shift information and the spatial information in the X axis-direction from the echo train signals Sig.

Figure 4:
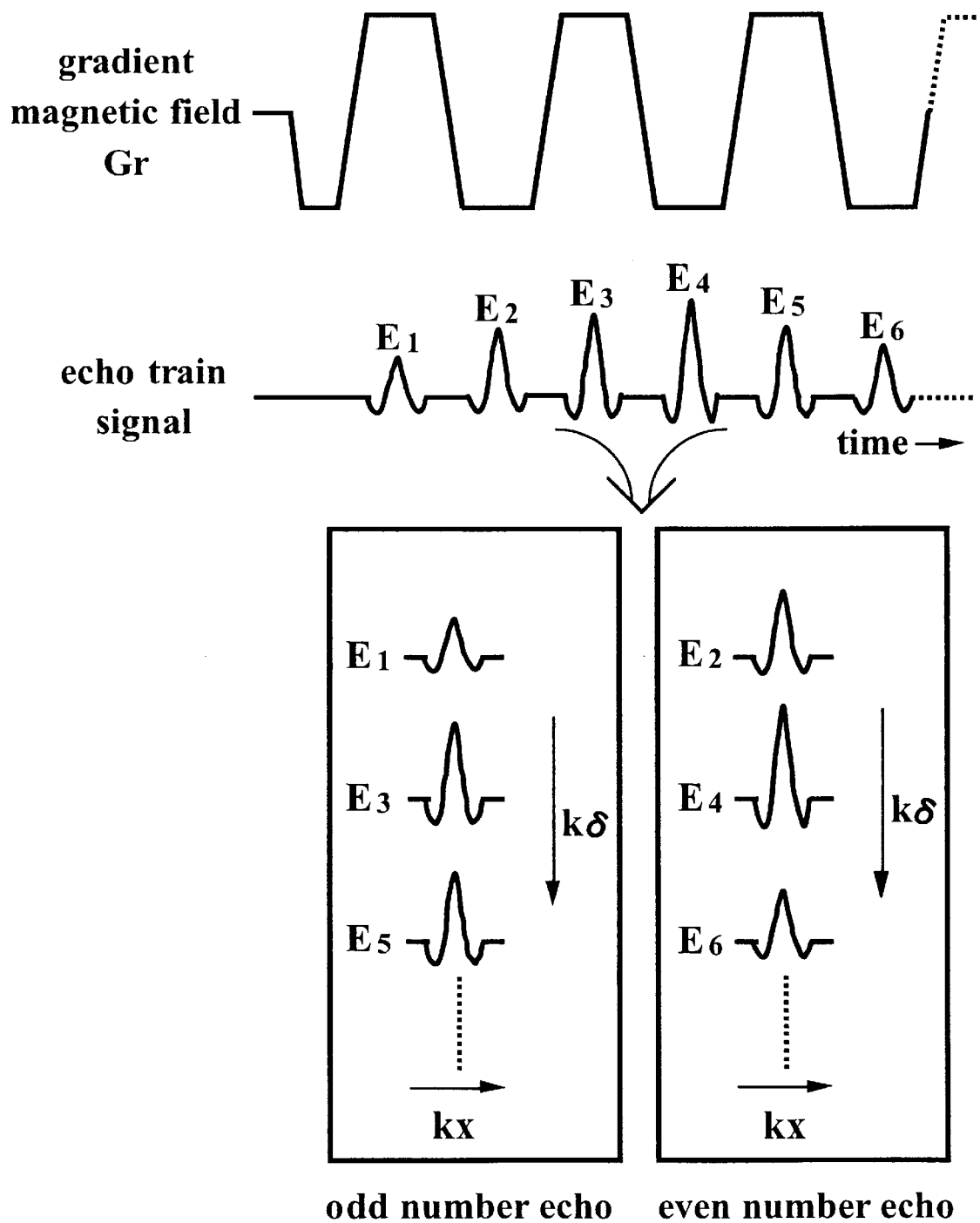
FIG. 4 is a diagram for explaining a signal processing method of obtaining chemical shift information in accordance with a magnetic resonance signal measured using the echo planar spectroscopic imaging pulse sequence.

As illustrated in FIG. 4, after dividing one phase-modulated echo train signal Sig into the respective echoes E1, E2, E3, . . . and classifying them into a group of odd number echoes E1, E3, . . . and that of even number echoes E2, E4, . . . , the rearrangement of them is performed in a 2-dimensional manner along a time axis kδ that is newly defined. In the resultant 2-dimensional data arrangement, time variations in the signals along the time axis kδ are determined by the internal magnetic interaction that is purely equivalent to the chemical shift. This is because the periodicity of the inversion of the reading-out gradient magnetic field Gr causes the external magnetic interaction due to Gr to be vanished along the kδ axis.

Meanwhile, configurations of the individual echo signals along a kx axis are ruled by the external magnetic interaction due to Gr. The spatial information in the Y axis-direction and the Z axis-direction are phase-encoded by the gradient magnetic fields Ge1, Ge2 along a ky axis and a kz axis that are perpendicular to the kx axis. The series of echo train signal Sig are obtained in this way, which makes it possible to measure a 4-dimensional Fourier space (kδ axis, kx axis, ky axis, and kz axis) that is connected with a 4-dimensional real space (chemical shift (δ) axis, X axis, Y axis, and Z axis) through the Fourier transformation.

Here, the number of the matrices in each axis, in the reading-out axis-direction, is determined by the number of the sampling points per echo as is the case with the EPI. The number of the spectrum points in the chemical shift axis-direction is determined by one-half of the number of echoes included in one echo train. The numbers of the pixels in the phase-encoding axis-directions are determined by the numbers of the application intensity steps (the step numbers) of the fields Ge1, Ge2. Then, applying the 4-dimensional inverse Fourier transformation to a 4-dimensional data arrangement of these makes it possible to obtain the chemical shift image.

The two pieces of chemical shift images, which are created using the odd number-echo group and the even number-echo group, are added to each other after the phases have been corrected. Incidentally, in the case where Gr is driven with the use of a sine wave, a trace along which the Fourier space is scanned takes on a sine wave-like form. Accordingly, it is required to apply the 4-dimensional inverse Fourier transformation that includes the correction of the sine wave-like form.

As having been described earlier, the magnitude of the chemical shift, i.e., the subject of the detection carried out by the MRSI, is of the order of ppm (i.e., 1/1-millionth), which is exceedingly small. As a result, it becomes important to adjust the homogeneity of the magnetic field that exerts influences on the magnetic resonance frequency. This situation requires that the homogeneity of the magnetic field be enhanced in the state where the existence of the object is included. As the method of adjusting the degree of the static magnetic field homogeneity, there has been proposed the following method: The two kinds of values, i.e., the respective offset values of the gradient magnetic fields in the mutually different three directions and amounts of the electric currents to be flowed through the respective shimming coils, are varied, thereby adjusting the degree of the static magnetic field homogeneity. In this method, with a phantom employed as the subject to be measured, the reference image is measured in advance that indicates the current-magnetic field distribution characteristics of the respective gradient magnetic field generating coils and the respective shimming coils. Next, after the object is inserted into the magnetic field, the magnetic field distribution image of the object is measured as the target image of the subject to be shimmed the degree of the static magnetic field homogeneity of which is to be adjusted. Then, the current-magnetic field distribution characteristics of the respective gradient magnetic field generating coils and the respective shimming coils are obtained from the reference image. Moreover, the combinations of the distribution characteristics (values of the currents to be flowed through the respective coils) are calculated so that the magnetic field distribution within the object becomes uniform, then adjusting the respective current values in accordance with the combinations calculated.

By the way, the phase distribution image obtained by the MRI is employed as the reference image and the target image. Conventionally, in order to measure this phase distribution image, the modulated spin echo pulse sequence has been used in which the spin echo time and the gradient echo time are each shifted. On the other hand, as the case of the high-speed MRSI sequence illustrated in FIG. 3, in the multi-gradient echo type pulse sequence for the purpose of shortening the measurement time, it must be carried out to correct the inhomogeneity of the static magnetic field attributed to the influences of the eddy current.

Namely, toward the single excitation, the gradient polarity of the high-intensity gradient magnetic field is inverted continuously in a short period of time so as to measure the series of echo train signals including the different spatial information. The repetition of the inversion of the gradient magnetic field causes the eddy current of large amplitude to occur on. such places as the inner surface of the bore within the magnet or the surface of the object. Then, the magnetic field that the eddy current induces makes inhomogeneous the magnetic field distribution at the time of detecting the signals. In the apparatuses that perform imaging methods by which the eddy current of large amplitude occurs in this way, there are many cases where, in order to cancel out the influences of the eddy current, the gradient coil equipped with the active shield is used. It is difficult, however, to completely cancel out the eddy current occurring on the inner surface of the magnet bore, and thus the active shield exhibits no effect of canceling out the eddy current on the object surface. This, in the static magnetic field distribution within an imaged region, results in a discrepancy between the imaging methods, such as the spin echo pulse sequence method by which the eddy current of only small amplitude occurs, and the imaging methods such as the high-speed MRSI by which the eddy current of large amplitude occurs. consequently, with the shimming method using the spin echo pulse sequence, it is impossible to entirely eliminate the inhomogeneity of the static magnetic field at the time of the imaging by the high-speed MRSI.

Next, the explanation will be given below concerning the characteristic of the present invention, 15 i.e., a concrete embodiment of the adjusting procedure that makes it possible to enhance the degree of the static magnetic field homogeneity at the time of the imaging by the high-speed MRSI.

(Pre Scan)

First, prior to the main measurement (main scan) of the magnetic resonance spectroscopic image, the pre measurement (pre scan) is executed in which the application intensities of the fields Ge1, Ge2 are set to 0 in the imaging sequence illustrated in FIG. 3. The signal processing explained in FIG. 4 is applied to echo train signals obtained by the pre scan, thereby obtaining a magnetic resonance spectroscopic image that has only 2-dimensional information on the spatial information in the X axis-direction and the chemical shift information in a predetermined slice (volume).

Next, by adding all the obtained spectra of the reading-out points (of the points in the X axis-direction), a spectrum (integrated spectrum) over the entire slice (volume) is created. Moreover, a signal peak corresponding to a hydrogen nucleus contained in a water molecule is extracted from the integrated spectrum. In executing this extraction, usually, a peak that takes on the maximum intensity in the entire spectrum is defined as the water signal peak.

Incidentally, depending on the portion, it can be considered that a peak intensity of a fat signal exceeds the peak intensity of the water spectrum. In that case, taking advantage of a difference in the chemical shift between the fat and the water (about 3.5 ppm) allows the spectrum of the water to be isolated in advance from that of the fat. Then, offset current values for the gradient magnetic fields are adjusted so that a half-value width of the water signal peak becomes the minimum, thereby enhancing the degree of the static magnetic field homogeneity.

FIG. 1 shows, as a form of a flow chart, an embodiment of the procedure that adjusts the degree of the static magnetic field homogeneity by adjusting the offset current values for the gradient magnetic fields. First, at the starting of the adjustment, initial values of a counter n and a half-value width $dF(0)$ are reset to $0(S1)$. Also, offset current initial values of gradient magnetic fields, i.e., $GxOff(0)$, $GyOff(0)$ and $GzOff(0)$ for the three-axis (X axis, Y axis, Z axis) directions are reset to a predetermined fixed value, for example, $0$ (S2). Next, the counter n is incremented (S3), and then the 1st pre scan is executed.

In the 1st pre scan, the offset current initial values for the gradient magnetic fields are set to predetermined values $GxOff(1)$, $GyOff(1)$ and $GzOff(1)$, and the imaging sequence illustrated in FIG. 3 is executed so as to measure echo train signals (S4). Next, the signal processing explained in FIG. 4 is performed in accordance with the echo train signals thus measured, and a water signal peak is extracted from the integrated spectrum, then calculating a half-value width thereof $dF(1)$ (S5). More-over, the calculated half-value width $dF(1)$ is compared with the half-value width obtained by the pre scan at the previous time. If $dF(1)$ is found to be smaller than the half-value width at the previous time, the process returns to the step S3 and the counter n is incremented, and then the pre scan is repeated by going through the steps S4 to S6. In this repeated pre scan, the measurement of the water peak width is executed in such a manner that an offset current value for the first direction of gradient magnetic field of the three directions of gradient magnetic fields is varied by an amount of a predetermined value (i.e., for example, d GxOff) every time the repetition is performed. Namely, in the 2nd pre scan, $GxOff(2)$, $GyOff(2)$ and $GzOff(2)$ are set as follows:

$$GxOff(2)=GxOff(1)+d\ GxOff$$

$$GyOff(2)=GyOff(1)$$

$$GzOff(2)=GzOff(1)$$

Next, a half-value width $dF(2)$ in the 2nd pre scan is calculated. Moreover, if the judgement at the step S6 proves to be $dF(2) \leq dF(1)$, going back to the step S3 again, the offset current values in each axis are varied and the above-described processing is repeated. Namely, $GxOff(n)$, $GyOff(n)$ and $GzOff(n)$ are set as follows, and then the n-th $(n \geq 3)$ pre scan is executed:

$$GxOff(n)=GxOff(1)+(n-1)Xd\ GxOff$$

$$GyOff(n)=GyOff(1)$$

$$GzOff(n)=GzOff(1)$$

In the n-th pre scan, if, in the judgement at the step S6, a half-value width dF(n) proves to be less than a half-value width dF(n−1), the steps S3 to S6 are repeated. Meanwhile, if, in the judgement at the step S6, dF(n) is larger than dF(n−1), the processing proceeds to a step S7 or thereafter. At the step S7, it is judged whether or not the value of the counter n exceeds 2. If not, processings at steps S8 to S12 are executed. If the value exceeds 2, the processing jumps up to a step S13. Namely, if the value of the counter n is found to exceed 2 at the step S7, an optimum offset current value in the first direction, i.e., (Gx0ff(1)+(n−1)×d Gx0ff), is determined.

Also, if, in the judgement at the step S7, the value of the counter n does not exceed 2, 1 is added to the value of the counter n at the step S8, then executing the processing at the step S9. At the step S9, the offset current values in the respective axes are each set as follows, and then the n-th (n≧3) pre scan is executed in much the same way as described earlier:

Gx0ff(n)=Gx0ff(1)−(n−2)×d Gx0ff

Gy0ff(n)=Gy0ff(1)

Gz0ff(n)=Gz0ff(1)

Furthermore, if, at the step S11 as is the case with the step S6, the half-value width dF(n) in the n-th pre scan proves to be less than the half-value width dF(n−1), the steps S8 to S10 are repeated. Meanwhile, if dF(n) is larger than dF(n−1), the processing proceeds to the step S12, and the optimum offset current value in the first direction, Gx0ff(opt), is determined to be (Gx0ff(1)−(n−2)×d Gx0ff).

Next, proceeding to the step S13 and a step S14, concerning an offset current value in the second direction that differs from the offset current value in the first direction, the same operations as those at the steps S2 to S12 are repeated, thereby determining the optimum value Gy0ff(opt). Additionally, at this time, the offset current value in the first direction is set to the optimum value Gx0ff(opt) determined at the step S12. After determining the optimum offset current value for the second direction of gradient magnetic field, i.e., Gy0ff(opt), proceeding to steps S15, S16 and concerning an offset current value in the third direction, the same operations as those at the steps S2 to S12 are repeated, thereby determining the optimum value Gz0ff(opt). Additionally, at this time, the offset current values in the first and the second directions are set to the optimum values determined at the steps S12, S14, respectively.

After the optimum offset current values for all the directions of gradient magnetic fields have been determined, the adjustment is finished (S17). Namely, the pre measurement (pre scan) to be executed prior to the main measurement (main scan) is terminated. Then, the pulse sequence controller 10 sets these optimum values to the offset current values for the respective directions of gradient magnetic fields (S18). Next, the controller 10, based on the optimum values, controls currents to be flowed through the respective coils generating gradient magnetic field 3 through the power source for gradient magnetic field 7, thereby generating the static magnetic field about which the static magnetic field inhomogeneity caused by the eddy current has been improved. After that, using the imaging sequence illustrated in FIG. 3, the controller 10 executes the MRSI imaging (the main measurement (main scan)). This makes it possible to measure the chemical shift information with the influences of the eddy current reduced, even if there is employed the multi-gradient echo type imaging pulse sequence that is the high-speed imaging method.

As having been explained earlier, while varying the offset current values of the gradient magnetic fields in the three directions in sequence and one by one by executing the pre scan, the magnetic resonance spectroscopic image is obtained that has only the 2-dimensional information on the spatial information in the X axis-direction and the chemical shift information. Next, by adding all the obtained spectra of the reading-out points (of the points in the X axis-direction), the spectrum (integrated spectrum) over the entire slice (volume) is created. In addition, the signal peak corresponding to the hydrogen nucleus contained in the water molecule is extracted from the integrated spectrum. Furthermore, the optimum offset current values of the gradient magnetic fields in the respective directions are determined toward which the degree of the steepness of the peak value becomes the highest. Finally, the application intensities of the gradient magnetic fields are adjusted in accordance with the optimum offset current values, thereby obtaining the data that makes it possible to improve the static magnetic field inhomogeneity caused by the eddy current.

Additionally, although the offset current values for the gradient magnetic fields have been adjusted in the embodiment illustrated in FIG. 1, the same effects can also be obtained when adjusting the values of the currents to be flowed through the respective shimming magnetic field generating coils. Also, although the half-value width of the water signal peak (i.e., a peak width corresponding to a 50%-attenuation value of the peak maximum value) have been employed in the embodiment illustrated in FIG. 1, it is also allowable to employ a peak width corresponding to a 20%-attenuation value of the peak maximum value.

Also, the same effects can also be obtained when, other than the echo planar spectroscopic imaging, EPSM (echo planar shift mapping) method and PREP (projection reconstruction echo planar) method are employed as the high-speed MRSI. These methods have been proposed by Mansfield and are described in literatures such as "Magnetic Resonance in Medicine", Vol. 1, pp. 370–386 (1984). Also, the explanation has been given concerning the case where the high-speed MRSI is executed after the adjustment of the static magnetic field. The effect of enhancing the picture quality, however, can also be obtained using the echo planar imaging that is the multi-gradient echo type pulse sequence as is the case with the echo planar spectroscopic imaging. Namely, after the degree of the static magnetic field homogeneity has been adjusted by the method explained in the above-described embodiments, the echo planar imaging pulse sequence is performed, thereby making it possible to obtain a high picture quality image in which the influences of the eddy current have been reduced.

Also, when observing a magnetic resonance signal other than the magnetic resonance signal from the hydrogen nucleus, the method illustrated in FIG. 1 is employed in advance so as to enhance the degree of the static magnetic field homogeneity, thereby allowing the same effect to be obtained.

What is claimed is:

1. A nuclear magnetic resonance imaging apparatus comprising:

a static magnetic field generating means for generating a static magnetic field to be applied to an object;

a skimming magnetic field generating means for generating shimming magnetic fields or a plurality of channels for adjusting a homogeneity of said static magnetic field;

a gradient magnetic field generating means for generating gradient magnetic fields for applying to said object in a first, second and third directions which are in different direction each other;

a radio frequency pulse generating means for generating a radio frequency pulse for applying to said object;

a signal detecting means for detecting magnetic resonance signals generated from said object;

a processing means for processing said magnetic resonance signals detected by said signal detecting means;

a pulse sequence controlling means for controlling said shimming magnetic field generating means, said gradient magnetic field generating means, said radio-frequency pulse generating means and said signal detecting means, and defining a pulse sequence; and an adjusting means for adjusting a homogeneity of said static magnetic field by controlling said shimming magnetic field generating means and/or said gradient magnetic field;

wherein said pulse sequence controlling means effects a pulse sequence of a multi-gradient system and an adjusting pulse sequence control for adjusting said homogeneity of said static magnetic field by detecting said magnetic resonance signals in a state where said gradient magnetic field in at least one direction is applied to said object inverting periodically a polarity of gradient of said gradient magnetic field;

wherein said processing means determines a magnetic resonance spectrum from said magnetic resonance signals detected in said adjusting pulse sequence control by division of signals of said magnetic resonance signals into signals of odd number and signals of even number with rearrangement thereof, and extracts a peak corresponding to a specific nucleus, in said magnetic resonance spectrum, and calculates a width of said peak; and wherein said adjusting means adjusts said homogeneity of said static magnetic field such that said width of said peak become narrow.

2. A nuclear magnetic resonance imaging apparatus according to claim 1, wherein said specific nucleus is hydrogen nucleus of water molecule.

3. A nuclear magnetic resonance imaging apparatus according to claim 1, wherein after an offset current which is flowed at a coil generating said gradient magnetic field in said first direction is changed by a constant value, said adjusting pulse sequence for adjusting said homoge-neity of said static magnetic field by said pulse sequence controlling means and the calculation said width of said peak by said processing means are repeated in a plural times, and an optimum offset current value is searched such that said width of said peak become narrowest.

4. A nulcear magnetic resonance imaging apparatus according to claim 3, wherein after said optimum offset current value which is flowed at the coil generating said gradient magnetic field in said first direction is searched, said adjusting means search an optimum offset current value which is flowed at a coil generating said gradient magnetic field in said second direction and an optimum offset current value which is flowed at a coil generating said gradient magnetic field in said third direction.

5. A nuclear magnetic resonance imaging apparatus according to claim 1, wherein after a current which is flowed at a shimming coil of only one channel is changed based on said width of said peak, said adjusting pulse sequence for adjusting said homogeneity of said static magnetic field by said pulse sequence controlling means and the calculation said width of said peak by said processing means are repeated for plural times, and an optimum current value which is flowed at said shimming coil of said only one channel is searched such that said width of said peak become narrowest.

6. A nuclear magnetic resonance imaging apparatus according to claim 5, wherein after said optimum current value which is flowed at said shimming coil of said only one channel is searched, said adjusting means search, sequentially, an optimum current value which is flowed at each of the other shimming coils except for said shimming coil of said only one channel.

7. A nuclear magnetic resonance imaging apparatus according to any one of claim 1 to 6, wherein a peak width at points having an intensity which is 50% or 20% of a maximum intensity of said peak is used as said width of said peak.

8. A nuclear magnetic resonance imaging apparatus, comprising:

a static magnetic field generating means for generating a static magnetic field to be applied to an object;

a shimming magnetic field generating means for generating a N-channel (N≧3) shimming magnetic field that adjusts degree of homogeneity of said static magnetic field;

a gradient magnetic field generating means for generating gradient magnetic fields in first, second and third directions to be applied to said object;

a radio frequency pulse generating means for generating a radio frequency pulse to be applied to said object;

a signal detecting means for detecting a magnetic resonance signal generated from said object;

a computing means for performing computation in accordance with said magnetic resonance signal detected by said signal detecting means;

a pulse sequence controlling means for controlling operations of said shimming magnetic field generating means said gradient magnetic field generating means, said radio frequency pulse generating means and said signal detecting means; and a static magnetic field homogeneity degree adjusting means for controlling said shimming magnetic field generating means and/or said gradient magnetic field generating means so as to adjust said degree of homogeneity of said static magnetic field, wherein said pulse sequence controlling means executes a pulse sequence of a multi-gradient system and a static magnetic field-adjusting pulse sequence control, said pulse sequence control being a control in which an exciting radio frequency pulse is applied simultaneously with said gradient magnetic field in said third direction so as to selectively excite nuclear spins contained in slice or volume in said third direction, and after a preset time has elapsed, an inverting radio frequency pulse is applied simultaneously with said gradient magnetic field in said third direction, and then a reading-out gradient magnetic field in said first direction is applied while inverting the gradient polarity thereof periodically, thereby generating an echo train signal including a chemical shift and spatial information in said first direction and then detecting said echo train signal; and said computing means determines a magnetic resonance spectroscopic image from said echo train signal detected by said static magnetic field-adjusting pulse sequence control by division of echo signals of said echo train signal into echo signals of odd number and echo signals of even number with rearrangement thereof, said magnetic resonance spectroscopic image having 2-dimensional information on said chemical shift and said spatial information in said first direction, and creates an integrated spectrum over the entire slice or volume, said integrated spectrum being obtained by adding spectra of reading-out points in said first direction, and extracts a peak corresponding to a specific nucleus from said integrated spectrum, then calculating a width of said peak; and said static magnetic field homogeneity degree-adjusting means adjusts said degree of homogeneity of said static magnetic field so that said peak width becomes narrow.

9. The nuclear magnetic resonance imaging apparatus according to claim 8, wherein said specific nucleus is a hydrogen nucleus in a water molecule.

10. The nuclear magnetic resonance imaging apparatus according to claim 8, wherein said static magnetic field homogeneity degree-adjusting means adjusts said degree of homogeneity of said static magnetic field so that said peak width becomes narrow by adjusting a first offset current value to be flowed through a first coil for generating a gradient magnetic field in said first direction, a second offset current value to be flowed through a second coil for generating said second direction of gradient magnetic field, and a third offset current value to be flowed through a third coil for generating a gradient magnetic field in said third direction, respectively, and, in a state where said second offset current value and said third offset current value are set to a predetermined fixed value, said static magnetic field homogeneity degree-adjusting means varies said first offset current value by a predetermined amount in accordance with said peak width, and after that, it is repeated a plurality of times by said pulse sequence controlling means to execute said static magnetic field-adjusting pulse sequence control and it is repeated a plurality of times by said computing means to execute said calculation of said peak width, thereby searching a first optimum offset current value so that said peak width becomes the narrowest; and after said first optimum offset current value has been searched, said static magnetic field homogeneity degree-adjusting means sets said first offset current value to said first optimum offset current value, and, in a state where said third offset current value is set to said predetermined fixed value, said static magnetic field homogeneity degree-adjusting means varies said second offset current value by a predetermined amount in accordance with said peak width, and after that, it is repeated a plurality of times by said pulse sequence controlling means to execute said static magnetic field-adjusting pulse sequence control and it is repeated a plurality of times by said computing means to execute said calculation of said peak width, thereby searching a second optimum offset current value so that said peak width becomes the narrowest; and after said second optimum offset current value has been searched, said static magnetic field homogeneity degree-adjusting means sets said first offset current value to said first optimum offset current value and sets said second offset current value to said second optimum offset current value, and varies said third offset current value by a predetermined amount in accordance with said peak width, and after that, it is repeated a plurality of times by said pulse sequence controlling means to execute said static magnetic field-adjusting pulse sequence control and it is repeated a plurality of times by said computing means to execute said calculation of said peak width, thereby searching a third optimum offset current value so that said peak width becomes the narrowest.

11. The nuclear magnetic resonance imaging apparatus according to claim 8, wherein, when searching an i-optimum current value to be flowed through an i-channel (i=1, 2, . . . , N) shimming coil, if a j-optimum current value to be flowed through a j-channel (j=1, 2, . . . , N, where j≠i) shimming coil has been already searched, said static magnetic field homogeneity degree-adjusting means passes a current the value of which is equal to said j-optimum current value through said j-channel (j=1, 2, . . . , N, where j≠i) shimming coil, and, if said j-optimum current value to be flowed through said j-channel (j=1, 2, . . . , N, where j≠i) shimming coil has not been searched yet, in a state where no current is flowed through said j-channel (j=1, 2, . . . , N, where j≠i) shimming coil and in accordance with said peak width, said static magnetic field homogeneity degree-adjusting means varies only a current value to be flowed through said i-channel (i=1, 2, . . . , N) shimming coil, and after that, it is repeated a plurality of times by said pulse sequence controlling means to execute said static magnetic field-adjusting pulse sequence control and it is repeated a plurality of times by said computing means to execute said calculation of said peak width, thereby searching, in sequence, said i-optimum current value to be flowed through said i-channel (i=1, 2, . . . , N) shimming coil so that said peak width becomes the narrowest.

12. The nuclear magnetic resonance imaging apparatus according to any one of claims 8 to 11, wherein, as said peak width, a peak width corresponding to a value is employed, said value being equal to 50% or 20% of a maximum intensity of said peak.

13. A nuclear magnetic resonance imaging method, comprising:

a step of generating a static magnetic field to be applied to an object;

a step of generating a shimming magnetic field for adjusting the degree of homogeneity of said static magnetic field;

a step of generating gradient magnetic fields in first, second and third directions to be applied to said object, said gradient magnetic fields being different from each other;

a step of generating a radio frequency pulse to be applied to said object;

a step of detecting a magnetic resonance signal generated from said object;

a computing step of performing computation in accordance with said magnetic resonance signal detected by a signal detecting means;

a pulse sequence controlling step of controlling said generation of said shimming magnetic field, said generation of said gradient magnetic field, said generation of said radio frequency pulse and an operation of detecting said magnetic resonance signal; and a static magnetic field homogeneity degree-adjusting step of controlling said generation of said shimming magnetic field and/or said generation of said gradient magnetic field so as to adjust said degree of homogeneity of said static magnetic field, wherein, at said pulse sequence controlling step, a multi-gradient system pulse sequence control is executed and a static magnetic field-adjusting pulse sequence control is executed, said pulse sequence control causing said magnetic resonance signal to be detected while applying said gradient magnetic field, in at least one direction among said three directions with a gradient polarity thereof being inverted periodically; and, at said computing step, a magnetic resonance spectrum is determined in accordance with said magnetic resonance signal by division of signals of said magnetic resonance signal into signals of odd number and signals of even number with rearrangement thereof, and a peak of the frequency component is extracted, then calculating a width of said peak, said magnetic resonance signal being detected by said static magnetic field-adjusting pulse sequence control, said peak corresponding to a specific nucleus; and, at said static magnetic field homogeneity degree-adjusting step, said degree of homogeneity of said static magnetic field is adjusted so that said peak width becomes narrow.

14. The nuclear magnetic resonance imaging method according to claim 13, wherein said specific nucleus is a hydrogen nucleus in a water molecule.

15. The nuclear magnetic resonance imaging method according to claim 13, wherein, at said static magnetic field homogeneity degree-adjusting step, an offset current value to be flowed through a coil for generating said gradient magnetic field in said first direction is varied by a predetermined amount in accordance with said peak width, and after that, it is repeated a plurality of times at said pulse sequence controlling step to execute said static magnetic field-adjusting pulse sequence control and it is repeated a plurality of times at said computing step to execute said calculation of said peak width, thereby searching an optimum offset current value so that said peak width becomes the narrowest.

16. The nuclear magnetic resonance imaging method according to claim 15, wherein, at said static magnetic field homogeneity degree-adjusting step, after searching said optimum offset current value to be flowed through said coil for generating said gradient magnetic field in said first direction, it is executed to search an optimum offset current value to be flowed through a coil for generating said gradient magnetic field in said second direction and an optimum offset current value to be flowed through a coil for generating said gradient magnetic field in said third direction.

17. The nuclear magnetic resonance imaging method according to claim 13, wherein, at said static magnetic field homogeneity degree-adjusting step, after only a current value to be flowed through one channel of shimming coil has been varied in accordance with said peak width, it is repeated a plurality of times at said pulse sequence controlling step to execute said static magnetic field-adjusting pulse sequence control and it is repeated a plurality of times at said computing step to execute said calculation of said peak width, thereby searching an optimum current value to be flowed through said one channel of shimming coil so that said peak width becomes the narrowest.

18. The nuclear magnetic resonance imaging method according to claim 17, wherein, at said static magnetic field homogeneity degree-adjusting step, after searching said optimum current value to be flowed through said one channel of shimming coil, it is executed to search, in sequence, optimum current values to be flowed through said shimming coils of a plurality of channels other than said one channel of shimming coil.

19. The nuclear magnetic resonance imaging method according to any one of claims 14 to 18, wherein, as said peak width, a peak width corresponding to a value is employed, said value being equal to 50% or 20% of a maximum intensity of said peak.

20. The nuclear magnetic resonance imaging method according to claim 13, wherein, at said pulse sequence controlling step, control of an echo planar imaging pulse sequence is executed after said degree of homogeneity of said static magnetic field has been adjusted.

21. A nuclear magnetic resonance imaging method, comprising:

a step of generating a static magnetic field to be applied to an object;

a step of generating a N-channel (N>3) shimming magnetic field that adjusts the degree of homogeneity of said static magnetic field;

a step of generating gradient magnetic fields in first, second and third directions to be applied to said object;

a step of generating a radio frequency pulse to be applied to said object;

a step of detecting a magnetic resonance signal generated from said object;

a computing step of performing computation in accordance with said magnetic resonance signal detected by a signal detecting means;

a pulse sequence controlling step of controlling operations of a shimming magnetic field generating means, a gradient magnetic field generating means, a radio frequency pulse generating means and said signal detecting means; and a static magnetic field homogeneity degree-adjusting step of controlling said shimming magnetic field generating means and/or said gradient magnetic field generating means so as to adjust said degree of homogeneity of said static magnetic field, wherein, at said pulse sequence controlling step, a multi-gradient system pulse sequence control is executed and a static magnetic field-adjusting pulse sequence control is executed, said pulse sequence control being a control in which an exciting radio frequency pulse is applied simultaneously with said gradient magnetic field in said third direction so as to selectively excite nuclear spins contained in slice or volume in said third direction, and after a preset time has elapsed, an inverting radio frequency pulse is applied simultaneously with said gradient magnetic field in said third direction, and then a reading-out gradient magnetic field in said first direction is applied while inverting the gradient polarity thereof periodically, thereby generating an echo train signal including a chemical shift and spatial information in said first direction and then detecting said echo train signal; and, at said computing step, a magnetic resonance spectroscopic image is determined from said echo train signal detected by said static magnetic field-adjusting pulse sequence control by division of echo signals of said echo train signal into echo signals of odd number and echo signals of even number with rearrangement thereof, said magnetic resonance spectroscopic image having 2-dimensional information on said chemical shift and said spatial information in said first direction, and an integrated spectrum over the entire slice or volume is created, said integrated spectrum being obtained by adding spectra of reading-out points in said first direction, and a peak corresponding to a specific nucleus is extracted from said integrated spectrum, then calculating a width of said peak; and, at said static magnetic field homogeneity degree-adjusting step, said degree of homogeneity of said static magnetic field is adjusted so that said peak width becomes narrow.

22. The nuclear magnetic resonance imaging method according to claim 21, wherein said specific nucleus is a hydrogen nucleus in a water molecule.

23. The nuclear magnetic resonance imaging method according to claim 21, wherein at said static magnetic field homogeneity degree-adjusting step, said degree of homogeneity of said static magnetic field is adjusted so that said peak width becomes narrow by adjusting a first offset current value to be flowed through a first coil for generating said gradient magnetic field in said first direction, a second offset current value to be flowed through a second coil for generating said gradient magnetic field in said second direction, and a third offset current value to be flowed through a third coil for generating said gradient magnetic field in said third direction, respectively, and, in a state where said second offset current value and said third offset current value are set to a predetermined fixed value, said first offset current value is varied by a predetermined amount in accordance with said peak width, and after that, it is repeated a plurality of times by said pulse sequence controlling means to execute said static magnetic field-adjusting pulse sequence control and it is repeated a plurality of times by said computing means to execute said calculation of said peak width, thereby searching a first optimum offset current value so that said peak width becomes the narrowest; and after said first optimum offset current value has been searched, said first offset current value is set to said first optimum offset current value, and, in a state where said third offset current value is set to said predetermined fixed value, said second offset current value is varied by a predetermined amount in accordance with said peak width, and after that, it is repeated a plurality of times by said pulse sequence controlling means to execute said static magnetic field-adjusting pulse sequence control and it is repeated a plurality of times by said computing means to execute said calculation of said peak width, thereby searching a second optimum offset current value so that said peak width becomes the narrowest; and after said second optimum offset current value has been searched, said first offset current value is set to said first optimum offset current value and said second offset current value is set to said second optimum offset current value, and said third offset current value is varied by a predetermined amount in accordance with said peak width, and after that, it is repeated a plurality of times by said pulse sequence controlling means to execute said static magnetic field-adjusting pulse sequence control and it is repeated a plurality of times by said computing means to execute said calculation of said peak width, thereby searching a third optimum offset current value so that said peak width becomes the narrowest.

24. The nuclear magnetic resonance imaging method according to claim 21, wherein, at said static magnetic field homogeneity degree-adjusting step, when searching an i-optimum current value to be flowed through an i-channel (i=1, 2, . . . , N) shimming coil, if a j-optimum current value to be flowed through a j-channel (j=1, 2, . . . , N, where j≠i) shimming coil has been already searched, a current the value of which is equal to said j-optimum current value is flowed through said j-channel (j=1, 2, . . . , N, where j≠i) shimming coil, and, if said j-optimum current value to be flowed through said j-channel (j=1, 2, . . . , N, where j≠i) shimming coil has not been searched yet, in a state where no current is flowed through said j-channel (j=1, 2, . . . , N, where j≠i) shimming coil and in accordance with said peak width, only a current value to be flowed through said i-channel (i=1, 2, . . . , N) shimming coil is varied, and after that, it is repeated a plurality of times at said pulse sequence controlling step to execute said static magnetic field-adjusting pulse sequence control and it is repeated a plurality of times at said computing step to execute said calculation of said peak width, thereby searching, in sequence, said i-optimum current value to be flowed through said i-channel (i=1, 2, . . . , N) shimming coil so that said peak width becomes the narrowest.

25. The nuclear magnetic resonance imaging method according to any one of claims 21 to 24, wherein, as said peak width, a peak width corresponding to a value is employed, said value being equal to 50% or 20% of a maximum intensity of said peak.

* * * * *